United States Patent
Tamaki et al.

(10) Patent No.: US 9,502,619 B2
(45) Date of Patent: Nov. 22, 2016

(54) SIDE-VIEW LIGHT EMITTING DEVICE INCLUDING BASE BODY HAVING PROTRUDING COMPONENT

(71) Applicant: NICHIA CORPORATION, Anan-shi, Tokushima (JP)

(72) Inventors: Hiroto Tamaki, Anan (JP); Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/710,723

(22) Filed: May 13, 2015

(65) Prior Publication Data

US 2015/0340569 A1    Nov. 26, 2015

(30) Foreign Application Priority Data

May 20, 2014    (JP) .................. 2014-104299

(51) Int. Cl.
| H01L 33/00 | (2010.01) |
| H01L 33/48 | (2010.01) |
| H01L 33/60 | (2010.01) |
| H01L 33/50 | (2010.01) |
| H01L 33/62 | (2010.01) |
| H01L 33/56 | (2010.01) |
| H01L 23/00 | (2006.01) |

(52) U.S. Cl.
CPC ............. *H01L 33/486* (2013.01); *H01L 24/97* (2013.01); *H01L 33/50* (2013.01); *H01L 33/56* (2013.01); *H01L 33/60* (2013.01); *H01L 33/62* (2013.01); *H01L 2224/16225* (2013.01)

(58) Field of Classification Search
CPC ............................ H01L 33/486; H01L 33/50

USPC .......................................................... 257/98
See application file for complete search history.

(56) References Cited

U.S. PATENT DOCUMENTS

| 5,357,056 A * | 10/1994 | Nagano ............... H01L 31/0203 174/549 |
| 2004/0046242 A1* | 3/2004 | Asakawa ............ H01L 31/0203 257/678 |
| 2005/0219835 A1 | 10/2005 | Nagayama |
| 2005/0277216 A1 | 12/2005 | Asakawa |
| 2008/0186714 A1 | 8/2008 | Nagayama |

(Continued)

FOREIGN PATENT DOCUMENTS

| JP | 08-264842 A | 10/1996 |
| JP | 2004-363537 A | 12/2004 |
| JP | 2005-277227 A | 10/2005 |
| JP | 2007-329219 A | 12/2007 |

(Continued)

*Primary Examiner* — Matthew Gordon
(74) *Attorney, Agent, or Firm* — Global IP Counselors, LLP

(57) ABSTRACT

A light emitting device has a base body equipped with a base material and a pair of connection terminals disposed from a first main face to a second main face that is on the opposite side from the first main face; a light emitting element connected to the connection terminals on the first main face; and a light reflecting member that covers the side faces of the light emitting element, the base material having a protruding component on the second main face, and the connection terminals being disposed on the first main face from the second main face on both sides of the protruding component, and being partly exposed from the light reflecting member on both sides of the first main face.

21 Claims, 6 Drawing Sheets

(56) References Cited

U.S. PATENT DOCUMENTS

| | | | |
|---|---|---|---|
| 2010/0142189 A1* | 6/2010 | Hong | C09K 11/616 362/97.3 |
| 2011/0175127 A1* | 7/2011 | Kanada | H01L 33/62 257/98 |
| 2012/0153317 A1* | 6/2012 | Emerson | G02F 1/133603 257/89 |
| 2012/0286310 A1* | 11/2012 | Kim | H01L 33/60 257/98 |
| 2013/0307013 A1* | 11/2013 | Chan | H01L 25/0753 257/99 |

FOREIGN PATENT DOCUMENTS

| | | |
|---|---|---|
| JP | 2008-010486 A | 1/2008 |
| JP | 2009-038184 A | 2/2009 |
| JP | 2010-157638 A | 7/2010 |
| JP | 2013-138262 A | 7/2013 |

* cited by examiner

SIDE-VIEW LIGHT EMITTING DEVICE INCLUDING BASE BODY HAVING PROTRUDING COMPONENT

CROSS-REFERENCE TO RELATED APPLICATIONS

This application claims priority to Japanese Patent Application No. 2014-104299 filed on May 20, 2014. The entire disclosure of Japanese Patent Application No. 2014-104299 is hereby incorporated herein by reference.

BACKGROUND

1. Field of the Invention

The present disclosure relates to a light emitting device.

2. Description of Related Art

Many different light sources have been used in electronic devices in the past. For example, side-view light emitting devices have been used as backlight light sources in the display panels of electronic devices. These light emitting devices includes a substrate and a light emitting element. The substrate has a chip-like base material that has a concave component, and a set of terminals that are formed on the surface of this base material and are connected to the light emitting element (see. JP H08-264842 A, for example).

It is desirable for a light emitting device, and particularly a side-view light emitting device, to be made smaller and thinner, and there have been various studies into making the substrate flatter, more compact, etc., in order to minimize the space occupied by the chip-scale package itself. However, if the thickness is merely reduced to make the substrate more compact, it is difficult to maintain adequate substrate strength and adhesive strength in the joining of the light emitting element to the substrate by flip-chip mounting.

SUMMARY

It is an object the present disclosure to provide a small, thin light emitting device with which adequate strength is ensured and reliability is high.

The present invention includes the following embodiments.

A light emitting device has:
a base body equipped with a base material and a pair of connection terminals, the connection terminals being disposed from a first main face of the base body to a second main face of the base body that is on the opposite side of the first main face;
a light emitting element connected to the connection terminals on the first main face; and
a light reflecting member that covers the side faces of the light emitting element,
the base material having a protruding component on the second main face, and
the connection terminals extending onto the first main face from both sides of the protruding component on the second main face, and being partly exposed from the light reflecting member towards two ends of the first main face.

Another light emitting device has:
a base body equipped with a base material and a pair of connection terminals, the connection terminals being disposed from a first main face of the base body to a second main face of the base body that is on the opposite side of the first main face;
a light emitting element connected to the connection terminals on the first main face; and
a light reflecting member that covers the side faces of the light emitting element,
the base material having a bent part that is bent to the second main face side, and
the connection terminals extending onto the first main face from the bent part on the second main face, and being partly exposed from the light reflecting member towards two ends of the first main face.

According to the present disclosure, it is possible to provide a small, thin light emitting device with which adequate strength is ensured and reliability is high.

DETAILED DESCRIPTION

Figure 1A:
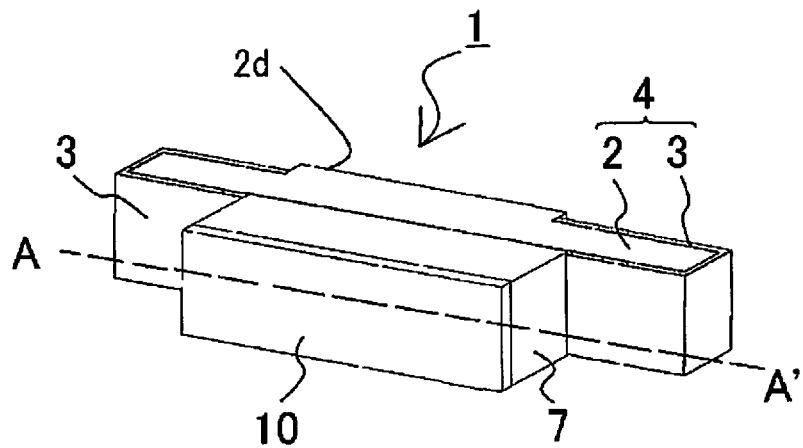
FIG. 1A is a simplified perspective view of the light emitting device in an embodiment of the present invention.

Embodiments for implementing the light emitting device of the present invention will be described below with reference to the accompanying drawings. In the following embodiment of the light emitting device that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the members in each of drawings are occasionally shown exaggerated for ease of explanation.

The light emitting device in an embodiment of the present invention is a so-called side-view type of light emitting device in which the mounting face is a face adjacent to the light extraction face, but can also be applied to a light emitting device called a top-view type, in which the mounting face is the face opposite the light extraction face.

This light emitting device includes at least a base body equipped with a base material and a pair of connection terminals, a light emitting element, and a light reflecting member.

In this Specification, the light extraction face of the light emitting device will be called the top face, faces that intersect or are adjacent to the light extraction face will be called side faces, and one of the side faces will be called the mounting face of the light emitting device. Because of this, of the faces of the various members or elements constituting the light emitting device, there will be times when the face corresponding to the light extraction face of the light emitting device is called the first main face or front face (that is, the top face), the face on the opposite side from the first main face is called the second main face (that is, the bottom face), and the faces that intersect or are adjacent to the first main face and the second main face (that is, faces corresponding to the side faces of the light emitting device) are called side faces.

(Base Body)

The base body includes a base material, and a pair of connection terminals corresponding to the positive and the negative, on at least the first main face of the base material. The shape of the base body may correspond to the shape of the base material to be described below. For example, it is more preferred that at least the first main face includes a long direction, and a short direction intersecting or orthogonally crossing the long direction.

The thickness of the base body can be according to a thickness of the base material to be described below. For example, the thickness of the thickest region is preferably about 500 μm or less, more preferably about 300 μm or less, further preferably about 200 μm or less. The thickness of the thickest region is preferably about 40 μm or more.

The strength of the base body can be adjusted according to a material of the base material to be described below, a material of the connection terminal, and so on. For example, within the above-described thickness range, the flexural strength is preferably 300 MPa or more, more preferably 400 MPa or more, further preferably 600 MPa or more. The strength of the light emitting device can be accordingly secured. The flexural strength here means a value measured by a three-point flexural test using a commercially available strength measuring apparatus, for example, from Instron Corporation.

When the base body is thin, and has a moderate strength as described above, a light emitting device which is small and thin and has high performance and high reliability is obtained.

(Base Material)

In an embodiment, the base material has a protruding component on the second main face. The size, number, position, height, and so forth of the protruding component can be adjusted as needed. For example, the size of the protruding component is preferably no more than about 80% of the surface area of the base body, and more preferably no more than about 70%, and better yet no more than about 60%. In particular, the size of the protruding component is preferably the same as, or slightly less or slightly greater than, the surface area of the light emitting element (discussed below). Examples of the position of the protruding component include a position adjacent to both sides of the base body, a position along the center line of the base body, and the center of the base body. Of these, the protruding component is preferably disposed along the center line of the base body. There may be two or more protruding components, or just one. It is particularly preferable for one to be disposed in a region of the second main face corresponding to the region where the light emitting element is installed on the first main face.

The height of the protruding component is preferably no more than about 80% of the thickness of the region of the base body where the protruding component is not disposed, and more preferably no more than about 70%, and better yet no more than about 60%, for example.

The thickness of the base material (including the protruding component) will depend on the material being used, the type and structure of the light emitting element to be installed, and so forth, but is preferably no more than about 470 μm, with no more than about 370 μm, no more than about 320 μm, no more than about 270 μm, no more than about 200 μm, 150 μm, and no more than about 100 μm being increasingly preferable. When strength and other such factors are taken into account, at least about 20 μm is preferable, and at least 30 μm is more preferable.

The protruding component may be formed in a thickness that is greater than the thickness of the region of the base material where the protruding component is not disposed, and in the region where the connection terminals are disposed, the thickness of the base material including the protruding component may be substantially the same as the thickness the base material including the connection terminals. In side-view mounting, it is preferable from the standpoint of mounting stability for the outermost face of the protruding component to be on the outside, rather than the outermost faces of the connection terminals.

Examples of how the protruding component is formed include a method in which the base material itself is formed during or after the production of the base material, a method in which part of the second main face of the base material is removed by cutting or laser working, and a method in which the protruding component is formed by affixing a member that is the same as the base material, or a different member.

Figure 5:
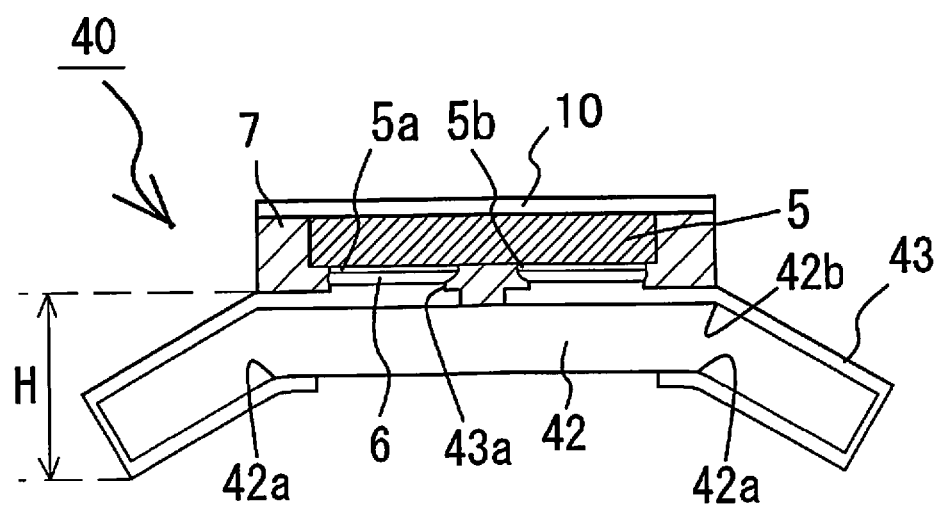
FIG. 5 is a simplified cross sectional view of the light emitting device in another embodiment of the present invention.

In another embodiment, the base material has a bent part. The bent part may bend either to the first main face side or to the second main face side, but as shown in FIG. 5, for example, it preferably bends to the second main face side. When the light emitting device is mounted as a side-view type, this prevents damage to the light reflecting member (discussed below) and avoids short-circuiting and other such problems. The bent part may be present at just one place on the second main face side, or at two places, or at three or more places. Having it at two places is preferable because it facilitates the mounting of the light emitting element and ensures adequate strength.

The position of the bent part is preferably slightly to the inside from both ends of the base material so that the ends of the base material will be easier to bend. This affords stable mounting in the mounting of the light emitting device in side-view configuration, and also ensures adequate strength. The bent part is preferably disposed at a place that intersects in the lengthwise direction, as long as the planar shape of the base material is one that extends in the lengthwise direction.

The angle of the bent part is, for example, greater than zero degrees and less than 90 degrees with respect to the top face of the base material where the bent part is not disposed (for example, the top face of the region corresponding to the region where the light emitting element is installed). It is particularly preferable for the angle to be about 1 to 40 degrees, about 1 to 30 degrees, or about 5 to 30 degrees. In other words, the angle of the bent part is such that the height from the first main face of the base material to the bent part distal end on the second main face side (see H in FIG. 5) is from 105 to 300% of the thickness of the base material itself (for example, the thickness in the region where the light emitting element is installed), and more preferably from 110 to 200%. From another standpoint, the height H is preferably no more than about 470 µm, with no more than about 370 µm, no more than about 320 µm, no more than about 270 µm, and no more than about 200 µm being increasingly preferable. When strength and other such factors are taken into account, an at least about 30 µm is preferable.

This allows good mounting stability to be ensured while affording simple machining. Also, adequate strength of the light emitting device can be achieved with the thickness of the thickness portion, without increasing the thickness of this thickest portion.

The bent part may be present not only on the second main face side, but also on the first main face side. When the bent part is disposed on the first main face side, it may bend either to the first main face side or to the second main face side, but as shown in FIG. 5, for example, it preferably bends to the second main face side. The position of the bent part on the first main face side may be a position that does not correspond to the bent part on the second main face side, but is preferably a position that does correspond to the bent part on the second main face side. In other words, the first main face and second main face of the base material are preferably both bent toward the second main face side. This configuration facilitates machining of the base material and readily ensures good strength.

There are no particular restrictions on how the bent part is formed, but examples include a method in which the base material itself is bent during or after the production of the base material, a method in which part of the second main face of the base material, or of both the first main face and the second main face, is removed by cutting or laser working.

In order to ensure good strength of the base body as a whole, the bending strength of the base material is preferably the same as the strength of the base body discussed above, such as at least about 300 MPa, and more preferably at least about 400 MPa or at least about 600 MPa.

The base material may be formed of any material as long as it has a linear expansion coefficient within ±10 ppm/° C. of the linear expansion coefficient of the light emitting element to be described below. Preferably, the linear expansion coefficient of the base material falls within ±9 ppm/° C., ±8 ppm/° C., ±7 ppm/° C. or ±5 ppm/° C. of the linear expansion coefficient of the light emitting element. Accordingly, peeling of the light emitting element from the base body (connection terminal) or application of undesired stress to the light emitting element due to a difference in linear expansion coefficient between the light emitting element and the base body, which has been a problem heretofore, can be effectively prevented when the light emitting element is mounted on the base body. Accordingly, electrodes of the light emitting element can be directly connected to connection terminals of the base body by flip-chip mounting, so that a smaller and thinner light emitting device can be provided.

In the present invention, the linear expansion coefficient means a value measured by the TMA method. One of α1 and α2 should satisfy this value, but it is more preferred that both α1 and α2 meet the value.

Examples of the base material include metals, ceramics, resins, dielectric materials, pulp, glass and paper or composite materials thereof (e.g. composite resins), or composite materials of the above-mentioned materials and conductive materials (e.g. metals, carbon etc.). Examples of the metal include copper, iron, nickel, chromium, aluminum, silver, gold and titanium or those including alloys thereof. Examples of the ceramic include aluminum oxide, aluminum nitride, zirconium oxide, zirconium nitride, titanium oxide and titanium nitride or those including mixtures thereof. Examples of the composite resin include glass epoxy resins.

Particularly, the base material is preferably one containing a resin. As the resin, any resin may be used as long as it is used in the art. Particularly, for ensuring that linear expansion coefficient of the base material falls within ±10 ppm/° C. of the linear expansion coefficient of the light emitting element, it is preferred to use a resin having a small linear expansion coefficient. Specific examples include epoxy resins, bismaleimide-triazine (BT) resins, polyimide resins, cyanate resins, polyvinyl acetal resins, phenoxy resins, acrylic resins, alkyd resins and urethane resins. For example, resins described in JP 2013-35960 A, WO 2011/132674, WO 2012/121224, WO 2012/165423 and the like, BT resins containing a naphthalene-based epoxy resin and compositions thereof, commercial products, and liquid crystal polymers described in JP 2010-114427 A and compositions thereof may be used. They may contain additives, monomers, oligomers, prepolymers and the like which are known in the art. Among those, BT resins or compositions thereof are preferred.

For controlling the linear expansion coefficient or increasing the heat emissivity irrespective of the type of the resin, it is preferred that the resin contains a filler, for example a filler formed of an inorganic material. By appropriately combining the type and amount of the filler, the linear expansion coefficient of the base material can be adjusted.

Examples of the filler and inorganic material include borate particles covered with hexagonal boron nitride, alumina, silicas (natural silica, fused silica, etc.), metal hydrates (aluminum hydroxide, boehmite, magnesium hydroxide, etc.), molybdenum compounds (molybdenum oxide, etc.), zinc borate, zinc stannate, aluminum oxide, clay, kaolin, magnesium oxide, aluminum nitride, silicon nitride, talc, baked clay, baked kaolin, baked talc, mica, glass short fibers (glass fine powders such as those of E glass and D glass, glass cloths, etc.), hollow glass, heat-shrinkable fillers such as zirconium phosphate, rubber powders and core-shell type rubber powders (styrene-based, butadiene-based, acryl-based and silicone-based rubber powders, etc.).

Particularly, by including a large amount of filler or inorganic material having high heat conductivity, the heat emissivity can be adjusted. For example, when a glass cloth is used, an inorganic material in the glass cloth can be included in an amount of 50 wt % or more, 70 wt % or more, or 90 wt % or more.

A mounting surface (R in FIG. 2) that is a surface neighboring a light extraction surface (Q in FIG. 2) and a surface (S in FIG. 2) opposite to the mounting surface in a side view type light emitting device, the base material is preferably black. Accordingly, stray light associated with light emitted from the light emitting device or reflected light thereof can be absorbed. Further, by absorption of stray light of the base material or the base body, variations in color and/or brightness of light, etc. can be suppressed to improve quality in, for example, backlight applications. By absorption of stray light, photodegradation of peripheral members can be suppressed.

For adjusting the color of the base material, the resin may contain a pigment. Examples of the pigment include black carbon black and white titanium oxide.

In a light emitting device having a small size, the light emitting element itself is relatively large with respect to the light emitting device, and therefore the light emitting device may excessively generate heat due to heat generation from the light emitting element, Stokes heat generation by a phosphor, or the like. Such heat may have adverse effects such as degradation and deformation of a light guide plate of a backlight. Thus, by including a black material having a large heat emissivity coefficient, such as carbon black, in the base material (resin), heat from the light emitting element and the phosphor can be released.

The linear expansion coefficient of the base material, depending on the type, a structure and the like of a light emitting element used, is, for example, preferably about 20 ppm/° C. or less, more preferably about 10 ppm/° C. or less, more preferably about 8 ppm/° C. or less, about 7 ppm/° C. or less, or about 6 ppm/° C. or less. When the base material has the above-mentioned linear expansion coefficient, the linear expansion coefficient of the base body itself can be controlled. Accordingly, as described below, even when flip-chip mounting of the light emitting element is performed, the light emitting element can be strongly connected to the base body despite a temperature change in the production process etc., so that defects such as a connection failure of the light emitting element can be avoided. As a result, the production yield of the light emitting device can be improved.

The plane shape of the base material is, for example, a circle, a polygon such as a quadrangle, or a shape close thereto. Among those, a rectangle, i.e. a shape that is narrow and long in the long direction is preferred. The size is preferably larger than the later-described light emitting element in terms of a plane area. When one light emitting element is carried on one light emitting device, the length of the light emitting device in the long direction is preferably about 1.5 to 5 times, more preferably about 1.5 to 3 times of the length of one side of the light emitting element. The length of the light emitting device in the short direction is preferably about 1.0 to 2.0 times, more preferably about 1.1 to 1.5 times of the length of one side of the light emitting element. When a plurality of light emitting elements are carried on one light emitting device, the length of the light emitting device can be adjusted according to the number of the light emitting elements. For example, 2 or 3 light emitting elements are carried in the long direction, the length of the light emitting device in the long direction is preferably about 2.4 to 6.0 times or about 3.5 to 7.0 times of the length of one side of the light emitting element.

On the second main face of the base material, one or more layers having functions of reinforcement, heat release, a mark for alignment and so on may be provided using an insulator, a metal and the like.

(Connection Terminals)

The pair of connection terminals may be disposed from the first main face to the second main face of the base body. In this case, at least part of the edges of the connection terminals is preferably formed so as to match up with part of the edge of the first main face of the base body. In other words, the connection terminal are preferably formed so that part of the side faces of the connection terminals and part of the mounting face of the base body lie in the same plane. This allows the mounting board to come into contact with (or be extremely close to) the side faces of the connection terminals when the light emitting device is mounted on a mounting board. As a result, this enhances the mounting of the light emitting device. The "same plane" referred to here means that there is no step or almost none, and means that bumpiness of about a few microns to a few dozen microns is acceptable. The same applies to subsequent references to "the same plane" in this Specification.

In an embodiment, when the base material has a protruding component, the connection terminals extend onto the first main face from both sides of the protruding component on the second main face.

In another embodiment, when the base material has a bent part that is bent to the second main face side, the connection terminals extend onto the first main face from at least the bent part on the second main face.

The connection terminal, which is disposed from the second main face to the first main face of the base body, is preferred (i) to be provided so as to extend from the first main face onto the second main face through a via or a through-hole etc. provided so as to extend through the base material, or (ii) to be provided (e.g. in a U-shape in cross-sectional view) so as to extend from the first main face onto the second main face by passing over a surface present between the first main face and the second main face. Here, the surface present between the first main face and the second main face may refer to a part or the whole of one end surface present between the first main face and the second main face, or may refer to a part or the whole of two or more end surfaces present between the first main face and the second main face. The via or the through-hole etc. provided so as to extend through the base material may be provided on the protruding component.

The connection terminals usually have on the first main face an element connection section that is connected to the electrode of the light emitting element, and an external connection section that is connected to the outside of the light emitting device. The external connection sections are disposed on the first main face, a side face, and the second main face, or on the first main face and the second main face.

When the base material thus has the protruding component, the external connection sections of the connection terminals are disposed on both sides of the protruding component, and when the base material has the bent part that is bent to the second main face side, the external connection sections are disposed so as to cover the bent part. The connection terminals may be provided to the protruding component, but this will result in a narrow gap between the connection terminals (that is, the anode and cathode), creating the risk of short circuiting, so it is preferable not to form the connection terminals on the protruding component.

The connection terminal is not necessarily required to have the same width (e.g. length of the base body in the short direction) over the first main face, the end surface and/or the second main face of the base body, and may be formed so as to be only partially reduced or increased in width. Alternatively, the connection terminal may be partially covered with an insulating material (e.g. base material) so as to be reduced in width at the first main face and/or the second main face of the base body. Such a width-reduced region is preferably disposed on at least the first main face of the base body, and may be disposed on both the first main face and the second main face. Particularly, it is more preferred that the width-reduced region is disposed in the vicinity of the later-described light reflecting member when it is disposed on the first main face of the base body.

By disposing such a width-reduced region, a situation can be suppressed in which a bonding member such as that to be described below, etc. which is connected to the connection terminal, or flux or the like contained therein penetrates to below the later-described light reflecting member and further to below the light emitting element along the surface of the terminal.

By separating the element connection section from the end surface of the base body extending along the long direction, penetration of the flux can be suppressed in the same manner as described above when the light emitting element is mounted.

The width-reduced region is smaller in width than the element connection section. The width-reduced region is preferably gently reduced in width.

The base body may have a heat releasing terminal, a heat sink, a reinforcement member and so on in addition to the connection terminal electrically connected to the light emitting element. They may be disposed on any of the first main face, the second main face and the end surface, and in particular, preferably disposed below the light emitting element and/or the light reflecting member. The strength and reliability of the light emitting device can be accordingly enhanced. By enhancing the strength of the base body, distortion of the base body is reduced, so that moldability of the light reflecting member can be improved when the light reflecting member is molded using a mold.

When the heat releasing terminal or reinforcement terminal is conductive, and is provided between a pair of connection terminals, it is preferred that the heat releasing terminal or reinforcement terminal is covered with an insulating film. Bridging of the bonding member with the connection terminal and the heat releasing terminal or reinforcement terminal can be accordingly prevented. The heat releasing terminal, reinforcement terminal and/or the insulating film may be used as a protruding component.

Further, when a plurality of light emitting elements are disposed in one light emitting device, the light emitting device may include one or more additional connection terminals for electrically connecting the plurality of light emitting elements. The shape, position and the like of the connection terminal can be appropriately set according to the number of light emitting elements mounted on one base body, and the arrangement and connection form (parallel or series) thereof, etc.

The connection terminal can be formed from, for example, a single-layer film or laminated film of Au, Pt, Pd, Rh, Ni, W, Mo, Cr, Ti, Fe, Cu, Al, Ag or an alloy thereof. Among those, one excellent in conductivity and mountability is preferred, and a material having good bondability and wettability with the bonding member on the mounting side is more preferred. Particularly, copper or a copper alloy is preferred from the viewpoint of heat releasability. A film having a high light reflectivity, such as a single-layer film or laminated film of silver, platinum, tin, gold, copper, rhodium or an alloy thereof may be formed on the surface of the connection terminal. Specific examples of the structure of the connection terminal include laminated structures such as W/Ni/Au, W/Ni/Pd/Au, W/NiCo/Pd/Au, Cu/Ni/Cu/Ni/Pd/Au, Cu/Ni/Pd/Au, Cu/Ni/Au, Cu/Ni/Ag and Cu/Ni/Au/Ag. The thickness or the number of layers may partially vary.

The connection terminals may each be substantially flat or have irregularities on a surface connected to the light emitting element, i.e. the first main face. The connection terminals may each have a projection pattern at a position opposite to each of the electrodes of the light emitting element to be described below. Preferably, the projection pattern have a size comparable to that of the electrode of the light emitting element. Preferably, the connection terminal and the projection pattern are horizontal to a surface of the base body (surface connected to the light emitting element) so that the light emitting surface can be made horizontal when the light emitting element is carried on the base body. The projection pattern can be formed by, for example, an additive method, a semi-additive method or an etching method using photolithography such as a subtractive method.

For the connection terminal, a wire, a lead frame or the like may be used, but it is preferred to form a film of the above-described material by plating so that the connection terminal is substantially flat on the surface of the base body or forms the same plane with the base body. The thickness of the connection terminal is several μm to several tens μm. Particularly, it is preferred to form the projection pattern by laminating plating. The thickness of the projection pattern is several μm to several tens μm from the other region on the surface of the connection terminal.

The base body may itself form a protective element such as a capacitor, a varistor, a zener diode or a bridge diode, or may include a structure, which performs the function of these elements, as a part thereof in the form of, for example, a multilayer structure or a laminated structure. By using one that performs the above-mentioned element function, the base body can be made to function as a light emitting device without additionally carrying components. As a result, a high-performance light emitting device having improved electrostatic withstand voltage can be made smaller. For example, a protruding component may be a part of the base body in which a protective element is mounted by pressure-bonding a substrate mounting the protective element with a prepreg to incorporate an electric element into base material (see FIGS. 6A to 6C).

(Light Emitting Element)

The light emitting element is carried on the base body, and connected to the connection terminal on the first main face at the first main face of the base body.

One light emitting element, or a plurality of light emitting elements may be carried on one light emitting device. The size, shape and light emitting wavelength of the light emitting element can be appropriately selected. When a plurality of light emitting elements are carried, they may be disposed irregularly, or may be disposed regularly in the form of a matrix or the like, or periodically. A plurality of light emitting elements may be connected in any form of series connection, parallel connection, series-parallel connection or parallel-series connection.

Preferably, the light emitting element include at least a nitride semiconductor laminate. The nitride semiconductor laminate is formed by laminating a first semiconductor layer (e.g. n-type semiconductor layer), a light emitting layer and a second semiconductor layer (e.g. p-type semiconductor layer) in this order, and contributes to light emission. The thickness of the nitride semiconductor laminate is preferably about 30 μm or less, more preferably about 15 μm or less or about 10 μm or less. Preferably, the nitride semiconductor laminate has, on the same surface (e.g. surface on the second semiconductor layer side), both a first electrode (positive or negative) electrically connected to the first semiconductor layer and a second electrode (negative or positive) electrically connected to the second semiconductor layer. An ohmic electrode, a metal film, an electrode for external connection, and so on are included as components that form the first electrode and the second electrode.

Examples of the type and the material of the first semiconductor layer, the light emitting layer and the second semiconductor layer include various semiconductors such as group III-V compound semiconductors and group II-VI compound semiconductors. Specific examples include nitride-based semiconductor materials such as $In_XAl_YGa_{1-X-Y}N$ (0≤X, 0≤Y, X+Y<1), and InN, AlN, GaN, InGaN, AlGaN, InGaAlN and the like can be used. For the film thickness and the layer structure of each layer, those known in the art can be used.

The nitride semiconductor laminate is usually laminated on a growth substrate of a semiconductor layer.

Examples of the growth substrate of a semiconductor layer include those capable of epitaxially growing a semiconductor layer. Examples of the material of the above-mentioned board include insulating boards such as those of sapphire ($Al_2O_3$) and spinel ($MgAl_2O_4$), and the above-described nitride-based semiconductor boards. The thickness of the board is preferably about 190 μm or less, more preferably about 180 μm or less or about 150 μm or less.

The growth substrate of a semiconductor layer can be used for the light emitting device without being removed from the semiconductor laminate when a base body having light transmissivity, such as a sapphire base body is used. Alternatively, such a base body may be removed from the semiconductor laminate. The growth substrate can be removed using a laser lift-off method etc. Specifically, from the base body side, the semiconductor layer is irradiated with laser light (e.g. KrF excimer laser) that passes through the base body, so that a decomposition reaction is caused to occur at an interface between the semiconductor layer and the base body to remove the base body from the semiconductor layer. It is to be noted that the growth substrate may slightly remain at the end or the corner of the semiconductor layer besides the substrate completely removed from the semiconductor layer. The growth substrate can be removed before or after the light emitting element is mounted on the base body.

When the nitride semiconductor laminate is freed of the growth substrate of a semiconductor layer, a light emitting device that is thinner and smaller can be obtained. By removing a layer that does not directly contribute to light emission, absorption of light emitted from the light emitting layer, which is caused by the above-mentioned layer, can be inhibited. Further, scattering of light caused by the base body can be inhibited. Accordingly, luminous efficiency can be further improved. As a result, the luminance can be enhanced.

The light emitting element may have a laminated structure known as so called vertical dice or laminated dice, for example a laminated structure as described in JP 2008-300719 A or JP 2009-10280.

The shape of the light emitting element in plan view is preferably a quadrangle or a shape very close thereto. Among those, a rectangular shape (particularly, an elongated rectangular shape) is more preferable. The upper limit of the size of light emitting elements can be appropriately adjusted according to a size of the light emitting device. The length of one side of the light emitting element is, for example, about hundred μm to 2 mm, and the size is preferably about 1400×200 μm, about 1100×200 μm or about 900×200 μm.

(First Electrode and Second Electrode)

Preferably, the first electrode and the second electrode are formed on the same surface (surface opposite to the substrate when the substrate exists) of the semiconductor laminate. Accordingly, flip-chip mounting can be performed with the positive and negative connection terminals of the base body made opposite to the first electrode and the second electrode of the light emitting element.

The first electrode and the second electrode can be formed from, for example, a single-layer film or laminated film of Au, Pt, Pd, Rh, Ni, W, Mo, Cr, Ti and the like or an alloy thereof. Specific examples include laminated films laminated like Ti/Rh/Au, W/Pt/Au, Rh/Pt/Au, W/Pt/Au, Ni/Pt/Au and Ti/Rh from the semiconductor layer side. The film thickness may be any film thickness of films that are used in the art.

The thickness of the light emitting element is preferably 200 μm or less, more preferably 180 μm or less or 150 μm or less as a thickness including the electrode irrespective of presence/absence of the growth substrate of a semiconductor. The thickness of only the nitride semiconductor laminate freed of the board is preferably 20 μm or less, more preferably 15 μm or less or 10 μm or less.

Preferably, the light emitting element is flip-chip-mounted on the base body. In this case, the first electrode and the second electrode are usually bonded to the connection terminals of the above-described base body by a bonding member or the bump or the like described above. For the bonding member, any of the materials known in the art can be used, and examples include conductive bonding members. Specific examples include tin-bismuth-based solder, tin-copper-based solder, tin-silver-based solder, gold-silver-based solder and the like (specifically, alloys having Ag, Cu and Sn as main components, alloys having Cu and Sn as main components, alloys having Bi and Sn as main components, and the like), eutectic alloys (alloys having Au and Sn as main components, alloys having Au and Si as main components, alloys having Au and Ge as main components, and the like), conductive pastes of silver, gold, palladium and the like, bumps, anisotropic conductive materials, and brazing materials such as low-melting-point metals. Particularly, for example, with the use of a solder, along with the shape of the above-described connection terminal, and the position and size of the projection pattern, a high-accuracy self-alignment effect can be exhibited. Accordingly, the light emitting element is easily mounted in the right place, so that mass productivity can be improved, and smaller light emitting devices can be produced. When the growth substrate is removed, it is preferred to use an anisotropic conductive paste or an anisotropic conductive film. When the light emitting element is fixed to the connection terminal, the bonding member is set to have a thickness that is preferably about ¼ to 3 times, more preferably about 1 to 3 times of the thickness of the nitride semiconductor laminate. Accordingly, a further high-accuracy self-alignment effect can be exhibited, so that the light emitting device can be made smaller and thinner. For example, the thickness of the bonding member is preferably about 2 to 50 μm, more preferably about 5 to 30 μm.

(Light Reflecting Member)

The light reflecting member is a member having a function of sealing (covering) at least a part of the light emitting element or fixing the light emitting element to the base body. Examples of the material of the light reflecting member include ceramics, resins, dielectric materials, pulp, glass and composite materials thereof. Among those, resins are preferred because they can be easily molded into any shape.

Examples of the resin include thermosetting resins, thermoplastic resins, modified resins thereof and hybrid resins at least one of these resins. Specific examples include resins such as epoxy resin compositions, modified epoxy resin compositions (silicone-modified epoxy resins etc.), silicone resin compositions, modified silicone resin compositions (epoxy-modified silicone resins etc.), hybrid silicone resins, polyimide resin compositions, modified polyimide resin compositions, polyamide resins, polyethylene terephthalate resins, polybutylene terephthalate resins, polycyclohexane terephtalate resins, polyphthalamide (PPA), polycarbonate resins, polyphenylene sulfide (PPS), liquid crystal polymers (LCP), ABS resins, phenol resins, acrylic resins, PBT resins, urea resins, BT resins and polyurethane resins.

The light reflecting member may be light transmissive, but is more preferably a light shielding material having a reflectivity of 60% or more, 70% or more, 80% or more or 90% or more to light from the light emitting element.

Thus, it is preferred that the above-described material, e.g. a resin contains, for example, a light reflection material, a light scattering material, a colorant and the like such as titanium dioxide, silicon dioxide, zirconium dioxide, potassium titanate, alumina, aluminum nitride, boron nitride, mullite, niobium oxide, zinc oxide, barium sulfate, carbon black and various kinds of rare earth oxides (e.g. yttrium oxide and gadolinium oxide).

The light reflecting member may contain a fibrous filler such as glass fibers or wollastonite, or an inorganic filler such as carbon. The light reflecting member may contain a material having high heat releasability (e.g. aluminum nitride etc.). Further, the light reflecting member may contain the later-described phosphor.

Preferably, the light reflecting member may contain these additives in an amount of, for example, about 10 to 95% by weight, 20 to 80% by weight or 30 to 60% by weight based on the total weight of the light reflecting member.

When the light reflecting member contains a light reflection material, light from the light emitting element can be efficiently reflected. Particularly, by using a material having a light reflectivity higher than that of the base body (for example, by using a silicone resin containing titanium dioxide as a light reflecting member when aluminum nitride is used for the base body), light extraction efficiency of the light emitting device can be enhanced by reducing the size of the base body while handling characteristics are retained. When the light reflecting member contains only titanium dioxide as a light reflection material, it contains the light reflection material in an amount of preferably about 20 to 60% by weight, more preferably 30 to 50% by weight based on the total weight of the light reflecting member.

When the light emitting device has the light reflecting member, the strength of the light reflecting member during a process such as removal or peeling of a growth substrate or a support of the semiconductor layer can be improved. Further, the strength of the whole light emitting device can be secured. By forming the light reflecting member from a material having high heat releasability, heat releasability can be improved while the light emitting device is kept small.

The outer shape of the light reflecting member may be, for example, a cylindrical shape, a polygonal prism shape such as a quadrangular prism shape or a shape close thereto, a circular truncated cone shape, a polygonal truncated cone shape such as a quadrangular truncated cone shape, or a lens shape in part. Of these, the light reflecting member preferably has a shape that is narrow and long in the long direction of the base body. The light reflecting member preferably has a surface extending along the short direction of the base body.

The light reflecting member is preferably disposed in contact with a part or the whole of at least one side surface of the light emitting element so as to cover the side surface of the light emitting element, or preferably disposed in contact with the light emitting element so as to surround the entire periphery of the light emitting element. In this case, it is preferred that the light reflecting member is provided so as to be thin at the side surface (7a in FIG. 1) extending in the long direction of the light emitting device, and thick at the side surface (7b in FIG. 1) extending in the short direction of the light emitting device. The light emitting device can be accordingly made thinner.

Preferably, the light reflecting member is provided so as to fill a gap between the mounted light emitting element and the base body. The strength of the light emitting device can be accordingly enhanced. The light reflecting member disposed between the light emitting element and the base body may be a material different from the material covering the side surface of the light emitting element. Accordingly, suitable functions can be imparted to the light reflecting member disposed on the side surface of the light emitting element and the member disposed between the light emitting element and the base body.

For example, a material having a high reflectivity can be used for the light reflecting member disposed on the side surface of the light emitting element, and a material for strengthening adhesion between the light emitting element and the base body can be used for the member disposed between the light emitting element and the base body.

Particularly, the light reflecting member disposed between the light emitting element and the base body is preferably formed of a resin having a linear expansion coefficient within ±20% of the linear expansion coefficient of the connection terminal. From another point of view, the light reflecting member is formed of a resin having a linear expansion coefficient of preferably about 30 ppm/° C. or less, more preferably about 25 ppm/° C. or less. From still another point of view, the glass transition temperature is preferably 50° C. or lower, more preferably 0° C. or lower. The light reflecting member and the base body can be accordingly prevented from being peeled from each other.

An edge of the light reflecting member in plan view (plan view as seen from the light extraction surface side) may be disposed on the inside or outside from an edge of the base body. When the light reflecting member has a shape that is narrow and long in the long direction, one edge of the light reflecting member extending along the long direction preferably coincides with an edge of the base body extending along the long direction. That is, it is preferred that at least one of edges of the light reflecting member extending along the long direction forms the same plane with one of edges of the base body extending along the long direction, and it is more preferred that both edges of the light reflecting member form the same plane with both edges of the base body. Accordingly, the area of the light extraction surface can be increased, so that light extraction efficiency can be enhanced, without increasing the thickness of the light emitting device. An edge of the light reflecting member extending along the short direction is usually disposed on the inside from an edge of the base body extending along the short direction. The same plane herein not only means exactly the same, but also means that when the light reflecting member is slightly R-shaped, a part of the R shape is coincides with the end surface of the base body.

The size of the light reflecting member is preferably larger than the light emitting element in terms of a plane area as seen from the light extraction surface side. Particularly, the length of the outermost shape of the light reflecting member in the long direction is preferably about 1.01 to 4.0 times of the length of one side of the light emitting element. Specifically, a length of about 300 to 2000 μm is preferred, and a length of about 1000 to 1500 μm is more preferred.

The thickness of the light reflecting member (also referred to as a width from the end surface of the light emitting element to the outermost shape of the light reflecting member as seen from the light extraction surface side, or a minimum width of the light reflecting member at the side surface of the light emitting element) is, for example, about 1 to 1000 µm, preferably about 50 to 500 µm or about 100 to 200 µm. Preferably, the light reflecting member has such a height that when the light emitting element is carried on the base body, the upper surface of the light reflecting member forms the same plane with the upper surface of the light emitting element.

The light reflecting member can be formed by screen printing, potting, transfer molding, a compression molding or the like. When a molding machine is used, a mold release film may be used.

For light reflecting (covering) the whole of the side surface of the light emitting element, a surface of the light emitting element opposite to the base body, and so on, the light reflecting member is usually formed after the light emitting element is mounted on the base body. Further, the light reflecting member may be provided so as to cover the upper surface or the side surface of the light emitting element before the light emitting element is mounted on the base body.

(Light Transmissive Member)

Preferably, the upper surface of the light emitting element, i.e. the light extraction surface of the light emitting device is provided with a light transmissive member.

The light transmissive member preferably cover the upper surface of the light reflecting member when the side surface of the light emitting element is covered with the light shielding light reflecting member, and the upper surface of the light emitting element is not covered with the light reflecting member. The end surface of the light transmissive member may be covered with or may be not covered with the light reflecting member.

The light transmissive member is preferably one permeable to 60% or more, further preferably 70%, 80% or 90% or more of light emitted from the light emitting layer. The light transmissive member may be a member similar to the light reflecting member, or may be a member different from the light reflecting member. Examples include resins such as silicone resins, silicone modified resins, epoxy resins, epoxy modified resins, phenol resins, polycarbonate resins, acrylic resins, TPX resins, polynorbornene resins, and hybrid resins containing at least one of these resins, and glass. Among those, silicone resins or epoxy resins are preferred, and silicone resins having excellent light resistance and heat resistance are more preferred.

The light transmissive member is preferably one containing a phosphor that is excited by light from the light emitting element. As the phosphor, one known in the art can be used. Examples include yttrium-aluminum-garnet (YAG)-based phosphors activated by cerium, lutetium-aluminum-garnet (LAG)-based phosphors activated by cerium, nitrogen-containing calcium aluminosilicate ($CaO—Al_2O_3—SiO_2$)-based phosphors activated by europium and/or chromium, silicate (($Sr, Ba)_2SiO_4$)-based phosphors activated by europium, β-sialon phosphors, nitride-based phosphors such as CASN-based or SCASN-based phosphors, KSF-based phosphors ($K_2SiF_6$:Mn) and sulfide-based phosphors. Accordingly, there can be provided a light emitting device that emits mixed-color light (e.g. white light) of primary light and secondary light having a visible wavelength, and a light emitting device that is excited by primary light of ultraviolet light to emit secondary light having a visible wavelength.

The light transmissive member is preferably a layered member in which a plurality of particle layers containing a particulate phosphor are laminated, a transparent polycrystalline phosphor plate member, or a transparent single crystal phosphor plate member. Accordingly, in the light transmissive member, scattering can be further reduced, so that light extraction efficiency etc. can be further improved.

The phosphor is not necessarily contained in the above-mentioned member, but may be provided at various positions or various members in the light emitting device. For example, the phosphor may be provided as a phosphor layer applied or bonded onto a light transmissive member which does not contain a phosphor.

The light transmissive member may contain a filler (e.g. a diffusing agent, a colorant or the like). Examples include silica, titanium oxide, zirconium oxide, magnesium oxide, glass, a crystal or sintered body of a phosphor, and a sintered body of a phosphor and an inorganic binding material. Optionally, the refractive index of the filler may be adjusted. The refractive index is, for example, 1.8 or more.

The shape of particles of the filler may be any of a granular shape, a spherical shape, a hollow shape and a porous shape. The average particle size (median size) of the particles is preferably about 0.08 to 10 µm at which a light scattering effect is obtained with high efficiency. The amount of the phosphor and/or the filler is, for example, preferably about 10 to 80% by weight based on the total weight of the light transmissive member.

Examples of the method for forming a light transmissive member include a method in which a light transmissive member is molded in the form of a sheet, and bonded by a hot melt method or by an adhesive, a method in which a phosphor is deposited by an electrophoretic deposition method, and then impregnated with a light transmissive resin, potting, compression molding, a spraying method, an electrostatic coating method and a printing method. At this time, silica (Aerosil) or the like may be added for adjusting the viscosity or fluidity. Among those, a spraying method, particularly a pulse spraying method of injecting spray pulsewise, i.e. intermittently is preferred when a phosphor is included in the light transmissive member. By injecting spray intermittently, the injection amount of the light transmissive member per unit time can be decreased. Thus, by moving a spray injection nozzle at a low speed while injecting spray in a small injection amount, a phosphor can be uniformly applied to a coating surface having an irregularity shape. In the pulse spraying method, the wind speed of air can be reduced without reducing the jetting speed of slurry from the nozzle as compared to a continuous spraying method. Thus, the slurry can be properly supplied to the coating surface, and the applied slurry is not disordered by an air stream. As a result, a coating film having high adhesion between phosphor particles and the surface of the light emitting can be formed. A plurality of laminated thin particle layers containing a particulate phosphor can be formed. By controlling the number of laminated layers in this way, thickness accuracy thereof can be improved. Deviation of the distribution of the phosphor can be suppressed, light subjected to uniform wavelength conversion can be emitted, and occurrence of color irregularity etc. of the light emitting element can be avoided.

The pulse spraying method is a known method described in, for example, JP 61-161175 A, JP 2003-300000 and WO 2013/038953, and the use material and conditions etc. thereof can be appropriately adjusted. For example, slurry to be applied contains a solvent, a thermosetting resin and a particulate phosphor. Examples of the thermosetting resin include silicone resins, epoxy resins and urea resins. As a solvent, an organic solvent such as n-hexane, n-heptane, toluene, acetone or isopropyl alcohol can be used. For example, the phosphor is used in an amount of preferably 10 to 80% by weight. The slurry is adjusted to have a viscosity of preferably about 0.01 to 1000 mPa·s, more preferably about 0.1 to 100 mPa·s.

The thickness of the light transmissive member is, for example, about 1 to 300 µm, preferably about 1 to 100 µm, more preferably about 2 to 60 µm or about 5 to 40 µm.

Particularly, when the light transmissive member is laminated by the spraying method, the thickness of the light transmissive member is preferably 20 times or less, more preferably 10 times or less, 6 times or less, 4 times or less or 3 times or less of the total thickness of the nitride semiconductor laminate. When the light transmissive member has the above-mentioned thickness, there can be provided a light emitting device that is smaller and thinner while wavelength conversion of light is sufficiently performed.

From another point of view, the thickness of the light transmissive member is preferably 2 times or less of the thickness of the light reflecting member at the side surface of the light emitting element, more preferably 2 times or less of the minimum width, further preferably equal to or less than the minimum width. When the light transmissive member has a relatively small thickness as described above, light emitted from the light emitting element can be extracted only in one direction of the light extraction surface without being emitted from the end surface (side surface) of the light transmissive member, irrespective of whether or not the light transmissive member is covered with the light reflecting member, as to be described below. Accordingly, light extraction efficiency can be improved.

From still another point of view, a thickness from a lower end of the light emitting element to an upper end of the light transmissive member is preferably about 400 µm or less irrespective of the thickness of the light emitting element, more preferably about 350 µm or less, about 300 µm or less, or about 280 µm or less.

Particularly, in backlight applications, a light transmissive member having a relatively small thickness as described above can further enhance luminous efficiency of the light emitting element and luminous efficiency of the backlight. For example, as described above, the ratio of side surface light to front surface light can be reduced, so that efficiency of entrance of light to a light guide plate of the backlight can be enhanced. Further, the resin amount can be decreased, and therefore the ratio of a transparent resin having a relatively low heat emissivity can be reduced, so that heat accumulation can be reduced. At the same time, the contact area between the light emitting element and the phosphor or between phosphors can be increased, and a heat transfer path can be secured. Accordingly, heat releasability can be improved to improve luminous efficiency. Further, the distance between the surface of the light emitting element and the entrance of light to the light guide plate can be minimized, and therefore light can be made to enter the light guide plate with a higher luminance, so that luminous efficiency in the backlight can be enhanced.

The upper surface (light extraction surface) of the light transmissive member may be a flat surface, or the upper surface (light extraction surface) and/or a surface in contact with the light emitting element may be an irregularity surface such as a convex surface or a concave surface to control distribution of light. When a plurality of particle layers containing a particulate phosphor are laminated as described above, irregularities corresponding to the particle size of the phosphor are passed to the surface of the light transmissive member. Thus, by laminating a thin light transmissive member containing a phosphor, the amount of resin can be reduced to obtain a moderate irregularity shape while aggregation of the phosphor is prevented and detachment of the phosphor is prevented. As a result, light extraction is effectively performed. That is, when considering discoloration or life and heat releasability of the light transmissive member, a resin-containing member such as the light transmissive member is preferably as thin as possible as long as the adhesive strength etc. can be retained. On the other hand, there is the concern of detachment of the light transmissive member. However, these problems can be solved by reducing the amount of resin to obtain a moderate irregularity shape.

The light transmissive member may be provided in the light emitting device by bonding the light transmissive member to the upper surface of the light emitting element before the light emitting element is mounted on the base body. Particularly, when the light emitting element is formed of a semiconductor laminate freed of a growth substrate of a semiconductor layer, for example, the light emitting element is bonded or fixed to a hard light transmissive member of glass, ceramic or the like to enhance the strength of the light emitting element, so that handling characteristics, reliability of mounting of the light emitting element, and so on can be improved.

Hereinafter, embodiments of the light emitting device of the present invention will be described with reference to the drawings.

Embodiment 1

Figure 1B:
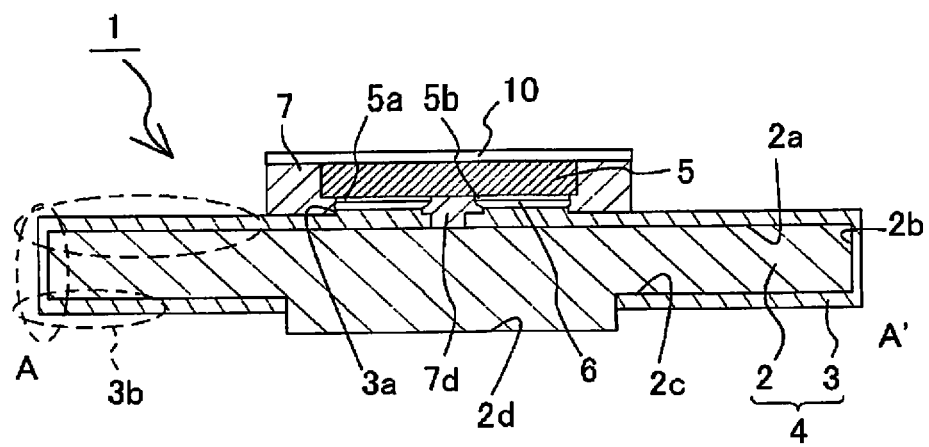
FIG. 1B is a cross section along the A-A' line of the light emitting device in FIG. 1A.
Figure 1C:
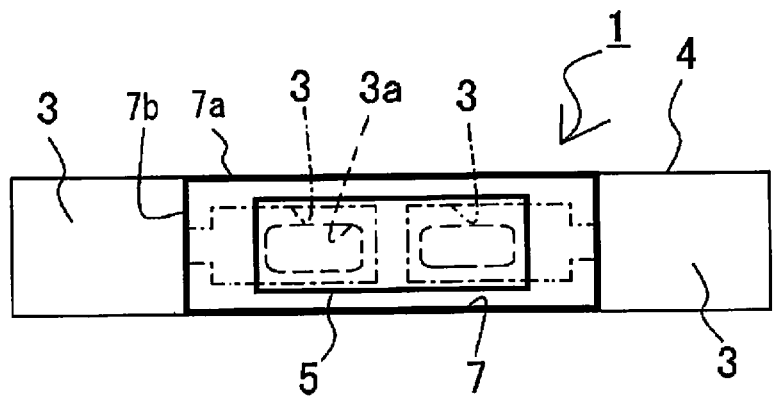
FIG. 1C is a simplified, see-through plan view of the light emitting device in FIG. 1A.

As shown in FIGS. 1A to 1C, a light emitting device 1 in this embodiment is made up of a base body 4 equipped with a base material 2 having a pair of connection terminals 3 on the first main face, a light emitting element 5, and a light reflecting member 7.

The base body 4 has a length of 1.8 mm in the long direction, a width of 0.3 mm in the short direction and a thickness of 0.45 mm, and functions as a wiring substrate. The strength of the base body is 300 MPa or more as measured by a tensile strength tester.

The base body 4 has a protruding component 2d in the approximate center of the bottom face 2c, which is the second main face of the base material 2. The thickness of the base material 2 at two ends is 200 µm, and the thickness in the center, including the protruding component 2d, is 230 µm.

The base material 2 is composed of a BT resin composition containing a naphthalene-based epoxy resin containing a commercially available glass cloth (HL832NSF type LCA manufactured by Mitsubishi Gas Chemical Company, Inc.). The base material 2 contains glass fibers, spherical silica, spherical silicone and carbon, and has a rectangular parallelepiped shape. The linear expansion coefficient of the base material 2 (without connection terminals) is about 3 ppm/° C., and the glass transition temperature of a resin that forms the base material 2 is about 280° C.

The connection terminals 3, which are produced by laminating Cu/Ni/Au (total thickness of 20 µm, coefficient of linear expansion of about 20 ppm/° C.) from the base material 2 side, are formed from the lower surface 2c on both sides of the protruding component 2d, to the upper surface 2a (the first main face) and the side faces 2b extending in the short-side direction.

A pair of connection terminals 3 are close to each other at the central part of the base material 2 on the upper surface 2a side, and each have a projection pattern 3a as an element connection section. The projection pattern 3a can be formed from a layer composed of copper (projection thickness: 20 µm) by plating using a mask. The projection patterns 3a are each situated at a position opposite to a corresponding one of a pair of electrodes formed on the light emitting element 5 to be described below, and have a size equivalent to that of the electrode.

A pair of connection terminals 3 are each continuously formed so as to extend in the long direction from the projection pattern 3a as an element connection section and pass along the upper surface 2a and the end surface 2b to the lower surface 2c of the base material 2. In the connection terminal 3, a region continuously extending from the projection pattern 3a as an element connection section to the lower surface 2c of the base material 2 (U-shaped region in cross-sectional view) is an external connection section 3b (see FIG. 1B).

The edge of the connection terminal 3 extending along the long direction coincides with the edge of the base body 4 extending along the long direction, and the end surface of the connection terminal 3 extending along the long direction forms the same plane with the end surface of the base body 4 extending along the long direction.

The connection terminal 3 has a width-reduced region between the projection pattern 3a and the external connection section 3b (see FIG. 1C). The connection terminal 3 has a region where a part of the external connection section 3b on the second main face of the base body 4 is reduced in width.

One light emitting element 5 is flip-chip-mounted on the projection pattern 3a of the connection terminal 3.

The light emitting element 5 has a nitride semiconductor laminate (thickness: about 8 to 12 µm) formed on a sapphire substrate (thickness: about 150 µm), and includes a pair of positive and negative electrodes 5a, 5b on a surface opposite to the sapphire substrate of the laminate. In the light emitting element 5, each of the pair of positive and negative electrodes 5a, 5b is connected to a corresponding one of the projection patterns 3a of a pair of connection terminals 3 of the base body 4 by a meltable bonding member 6 (thickness: 20 µm) that is Au—Sn eutectic solder. The surface of the sapphire substrate has irregularities (height: 0.5 µm, pitch: 10 µm), and therefore the corresponding surface of the nitride semiconductor laminate also has irregularities associated therewith.

By using these projection patterns 3a of the connection terminals, penetration of the bonding member into an unintended region can be prevented by performing quantitative control of the meltable bonding member 6 along with the shape and position of the projection patterns during mounting of the light emitting element. As a result, the light emitting element is aligned to an intended region with high accuracy, so that the light emitting element can be fixed in the right place.

The light emitting element 5 is a rectangular parallelepiped-shaped LED chip which has a length of 0.9 mm in the long direction, a width of 0.2 mm in the short direction and a thickness of 0.15 mm and emits blue light (light emission peak wavelength: 455 nm).

The light reflecting member 7 is molded in substantially a rectangular parallelepiped shape having a length (full length) of 1.2 mm in the long direction, a width (full length) of 0.3 mm in the short direction and a thickness of 0.15 mm. Edges of the light reflecting member 7 extending along the long direction coincides with edges of the base body 4 extending along the long direction.

The light reflecting member 7 is provided on the first main face of the base body 4 so as to be in contact with the light emitting element 5 such that the light reflecting member 7 covers the whole circumference of the side surface of the light emitting element 5 in contact therewith. The light reflecting member 7d is also provided on a surface of the light emitting element 5 opposite to the base body 4. That is, the light reflecting member 7d is disposed between the light emitting element 5 and the meltable bonding member 6 substantially completely covering the projection patterns 3a, and substantially completely covers the surface of the meltable bonding member 6.

Accordingly, light can be efficiently extracted from the light emitting element 5 to the upper surface. Since the light reflecting member 7 is also provided on a surface of the light emitting element 5 opposite to the base body 4, the light emitting element 5 can be more strongly connected to the base body 4.

The upper surface of the light reflecting member 7 substantially coincides with the upper surface of the light emitting element 5.

The light reflecting member 7 is formed of a silicone resin containing silica having an average particle size of 14 µm and titanium oxide having an average particle size of 0.25 to 0.3 µm as inorganic particles in amounts of 2 to 2.5 wt % and 40 to 50 wt %, respectively, based on the total weight of the light reflecting member 7. The silicone resin has a glass transition temperature of 40° C. and a linear expansion coefficient of about 50 ppm/° C.

The edge of the light reflecting member 7 extending along the long direction coincides with the edge of the base body 4 extending along the long direction, and the end surface of the light reflecting member 7 extending along the long direction forms the same plane with the end surface of the base body 4 extending along the long direction.

The light transmissive member 10 (thickness: 20 µm) is disposed on the light emitting element 5, i.e. a surface on a side opposite to a pair of positive and negative electrodes. The light transmissive member 10 is formed by laminating 3 layers of silicone resin containing a phosphor of YAG:Ce having a central particle size of about 8 µm using a pulse spraying method. The light transmissive member 10 covers the upper surface of the light reflecting member 7. The end surface of the light transmissive member 10 coincides with the end surface of the light reflecting member 7.

With this light emitting device, because the base body on which the light emitting element is installed has a protruding component in the center, adequate strength can be ensured even though the base body is extremely thin.

In this light emitting device, a base body carrying a light emitting element has an extremely low linear expansion coefficient, and therefore a difference in linear expansion between the light emitting element and the base body due to heat applied during and after the production process can be kept extremely low. Accordingly, peeling between the light emitting element and the base body or application of undesired stress, on the light emitting element, which results from a difference in linear expansion between the light emitting element and the base body, can be prevented, so that electric connection can be secured. As a result, a light emitting device having a long life and excellent characteristics can be obtained.

As described above, the base material that forms the base body is formed of a resin having a high glass transition temperature of 250° C. or higher and having a small linear expansion coefficient. This resin contains an inorganic filler such as $SiO_2$, $Al_2O_3$ or a glass cloth, and optionally carbon black having heat releasability, a silicone filler that imparts an elastic modulus, and so on at a high ratio. Accordingly, heat generated by driving of the light emitting element can be efficiently released. Particularly, when the resin is used for a base material stained black with carbon black or the like, heat can be efficiently released by heat radiation because the emissivity of a far infrared ray etc. is high. When the surface of the base body which is in contact with the light reflecting member is coated with a material having a high heat absorptivity, a material having a low heat absorptivity of an electromagnetic wave in a visible range, a material that absorbs an electromagnetic wave having a long wavelength, such as a far infrared ray, or a material having a high heat conductivity, heat releasability can be further enhanced. Accordingly, heat releasability of a small light emitting device can be improved, efficiency of wavelength conversion of light by a phosphor can be improved, and luminous efficiency of the light emitting element can be improved.

Figure 2:
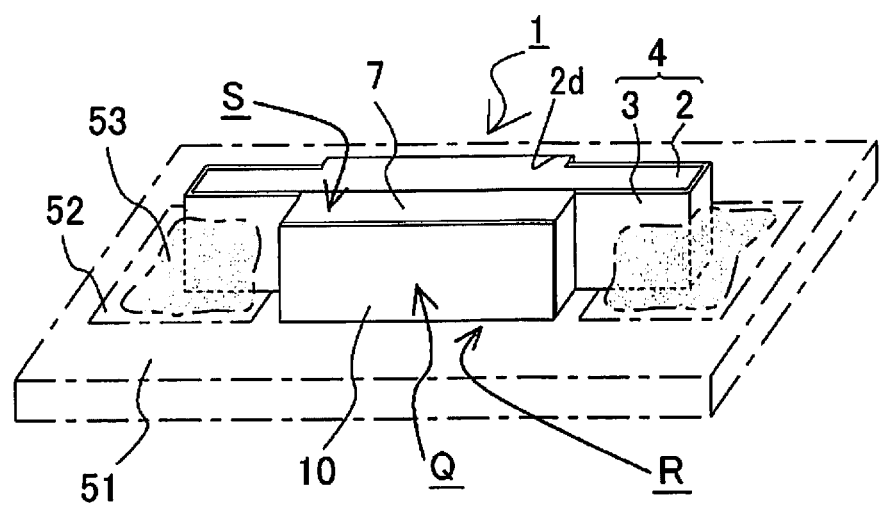
FIG. 2 is a simplified perspective view of the state when the light emitting device in FIG. 1A has been mounted on a mounting member.

In the light emitting device 1, each of a pair of end surfaces of the base body 4 extending along the long direction is disposed to form the same plane with a corresponding one of a pair of end surfaces of the light reflecting member 7 extending along the long direction as shown in FIG. 2. The light emitting device is mounted as a side view type on a mounting substrate 51 having a wiring pattern 52 on a surface thereof with one of the end surfaces (R in FIG. 2) which form the same planes as a mounting surface of the light emitting device 1.

In mounting, a pair of external connection sections 3b of the light emitting device 1 are placed on wiring patterns 52 corresponding to a positive electrode and a negative electrode of the mounting substrate 51, and connected thereto by solder 53. The solder 53 is connected such that the contact area with the small connection terminal 3 is enlarged over not only the first main face but also the end surface and the second main face of the base body 4 at the external connection section 3b curved in a U shape. Accordingly, a fillet can be formed on the side surface of the light emitting device, so that heat releasability and mounting stability of the light emitting device can be improved.

By disposing a width-reduced region between the projection pattern 3a and the external connection section 3b in the connection terminal 3, later-described solder connected to the external connection section 3b or flux contained therein can be prevented from penetrating below the light reflecting member 7.

Furthermore, both the side faces that run in the lengthwise direction of the light reflecting member and the side faces that run in the lengthwise direction of the base body 4 are in contact with the surface of a mounting board 51, in addition to which the protruding component 2d of the base body 4 increases the contact surface area with the mounting board 51. This ensures stable mounting. Also, since a base body with good heat dissipation is used, a heat dissipation path to the mounting board 51 can be further ensured.

Figure 3A:
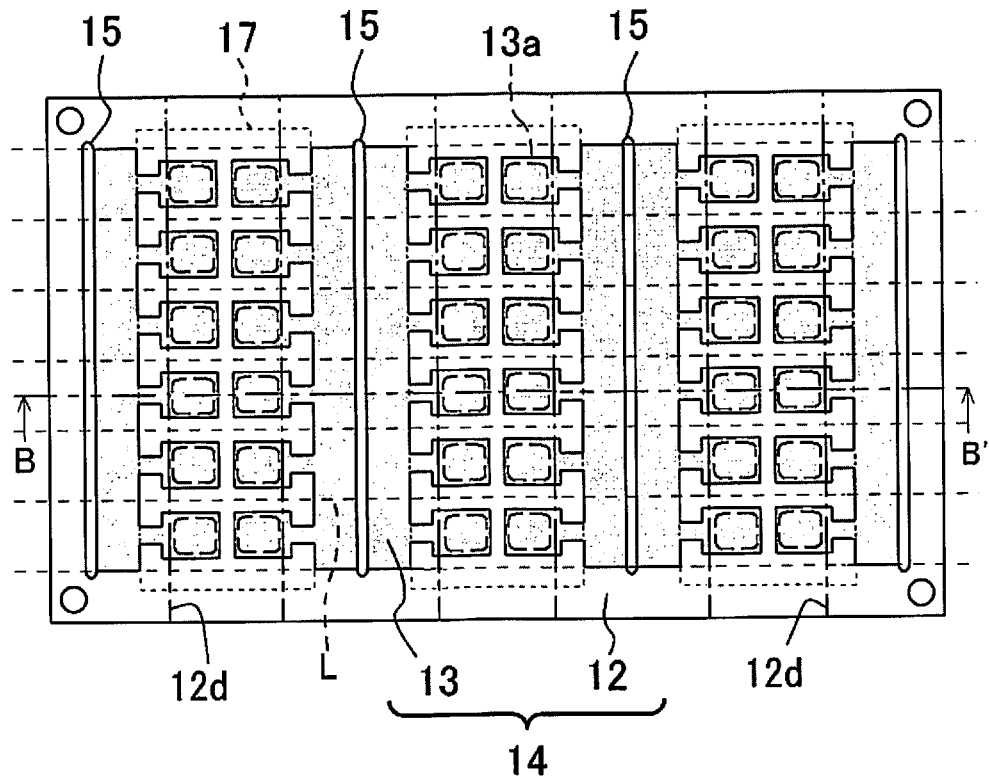
FIG. 3A is a simplified plan view illustrating a method for manufacturing the light emitting device in FIG. 1A.
Figure 3B:
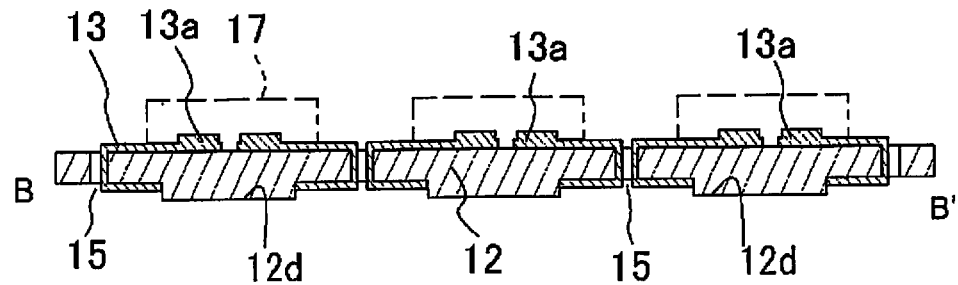
FIG. 3B is a cross section along the B-B' line in FIG. 3A.

The light emitting device 1 can be produced using a composite base body 14 with a composite connection terminal 13 formed on a base material 12 on which is formed a stripe-shaped protruding portion 12d on the rear face as shown in FIGS. 3A and 3B. The composite base body 14 is constituted by a plurality of linked pieces, each of which forms a substrate of a light emitting device after a dividing step.

The composite base body 14 has slits 15 extending from the upper surface to the back surface at the base material 12. The composite connection terminal 13 is provided so as to extend continuously from the upper surface to the lower surface of the base material 12 of the composite base body 14 through the inner wall of the slit 15. This composite base body 14 has opposing protrusion patterns 13a formed on its top face.

FIG. 3A shows the composite base body 14 for obtaining 18 light emitting devices, but the composite base body 14 for obtaining a larger number (several hundreds to several thousands) of light emitting devices may be provided in consideration of production efficiency.

This composite base body 14 can be formed by forming a slit 15 and a protruding component 12d on the bottom face and firing, in the formation of a sheet prior to the formation of the base material.

The light emitting elements 5 are connected onto the composite base body 14, a plurality of light reflecting members 17 are molded in a batch by transfer molding so as to cover the end surfaces of the light emitting elements 5, and a molded article is taken out.

Thereafter, the upper surface of the composite base body 14 exposed from the light reflecting member is masked, and the upper surface of the light emitting element 5 exposed from the upper surface of the light reflecting member 17 and the upper surface of the light reflecting member 17 are covered with the light transmissive member 10 by a pulse spraying method. Thereafter, the composite base body 14 and the light reflecting member 17 are cut in one direction along a division scheduled line L. Accordingly, because the slit 15 is disposed, the composite base body 14 is also separated in the extending direction of the slit, so that divided light emitting devices can be obtained with a relatively small number of man-hour.

A dicer, a laser or the like can be used for cutting.

In this embodiment, the light transmissive member 10 is formed from the upper surface of the light emitting element 5 to the upper surface of the light reflecting member 17 using a pulse spraying method, but the light transmissive member 10 may be formed only on the upper surface of the light emitting element 5.

The plate-shaped light transmissive member 10 having substantially the same shape as that of the light emitting element 5 in plan view may be bonded to the upper surface of the light emitting element 5, followed by forming the light reflecting member 17 so as to cover the end surfaces of the light emitting element 5 and the light transmissive member 10.

Modification Example 1 of Embodiment 1

Figure 4A:
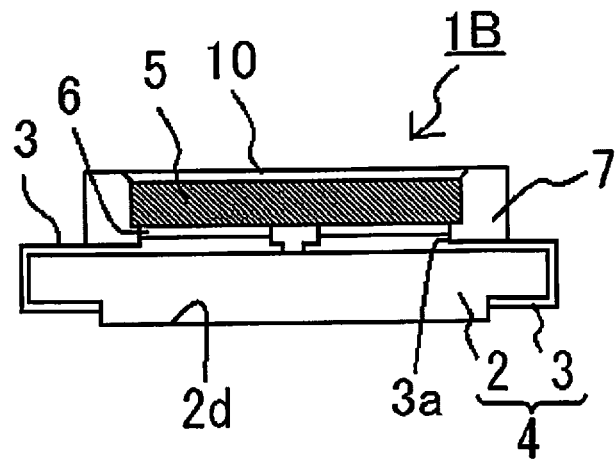
FIG. 4A is a simplified cross sectional view of the light emitting device in a modification example of an embodiment of the present invention.

In this embodiment, in the cross section of the light emitting device shown in FIG. 4A, a translucent member 10 covers the top face of the light emitting element 5 constituting the light emitting device 1B, and the translucent member 10 is substantially not disposed on the top face of the light reflecting member 7 covering the side faces of the light emitting element 5, but other than this, the configuration is substantially the same as that of the light emitting device 1 in Embodiment 1.

With this light emitting device 1B, the side faces of the translucent member 10 are covered by the light reflecting member. This configuration prevents light from being emitted from the side faces of the translucent member 10, which boosts light extraction efficiency.

This light emitting device 1B can be manufactured by the following method.

First, the light emitting element 5 is covered with the light reflecting member 7. After this, a mask having an opening over the light emitting element 5 is used to remove the light reflecting member 7, thereby forming a concave component that exposes the top face of the light emitting element 5 in the top face of the light reflecting member 7. The translucent member 10 is formed inside this concave component by pulse spraying with a mask, for example. This allows the translucent member 10 to be disposed only inside the concave component, and allows the side faces thereof to be covered with the light reflecting member 7.

Modification Example 2 of Embodiment 1

Figure 4B:
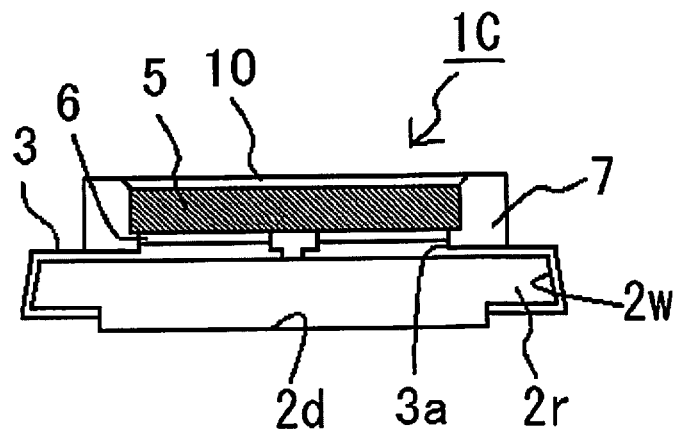
FIG. 4B is a simplified cross sectional view of the light emitting device in another modification example of an embodiment of the present invention.

As shown in FIG. 4B, the light emitting device 1C in this embodiment is configured substantially the same as in Embodiment 1 and its modification examples, except that the side faces 2w of a base material 2r constituting the base body are inclined so that the surface area of the bottom face is larger than that of the top face of the base material 2r.

This light emitting device 1C has the same effect as in Embodiment 1.

Modification Example 3 of Embodiment 1

Figure 4C:
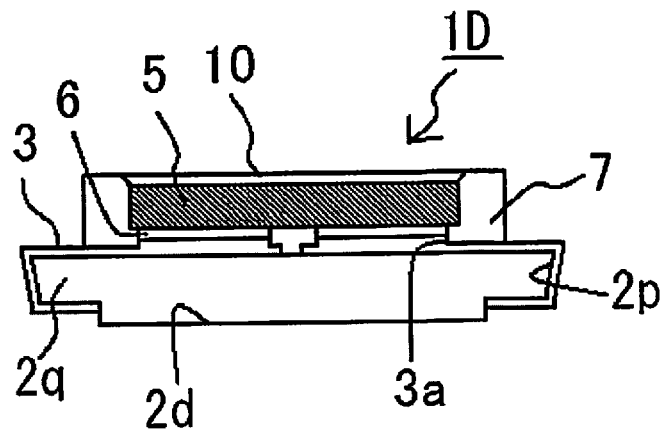
FIG. 4C is a simplified cross sectional view of the light emitting device in still another modification example of an embodiment of the present invention.

As shown in FIG. 4C, the light emitting device 1D in this embodiment is configured substantially the same as in Embodiment 1 and its modification examples, except that the side faces 2p of a base material 2q constituting the base body are inclined so that the surface area of the top face is larger than that of the bottom face of the base material 2q.

This light emitting device 1D has the same effect as in Embodiment 1.

Modification Example 4 of Embodiment 1

Figure 6A:
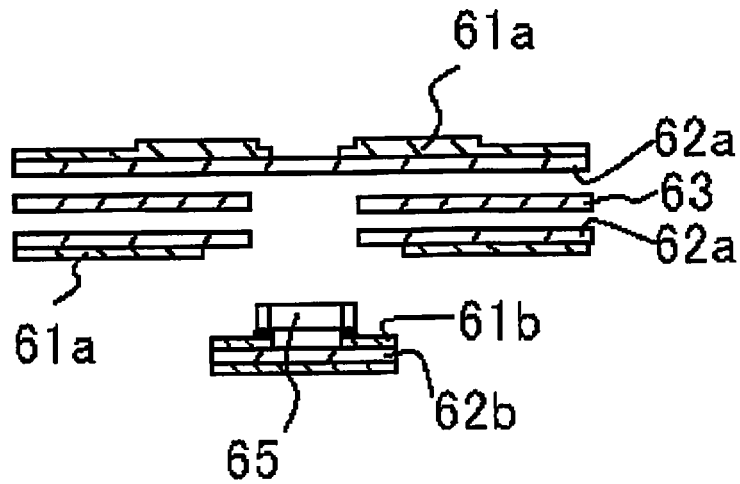
FIG. 6A is a simplified cross sectional view showing a method for manufacturing a light emitting device of another embodiment of the present invention.
Figure 6B:
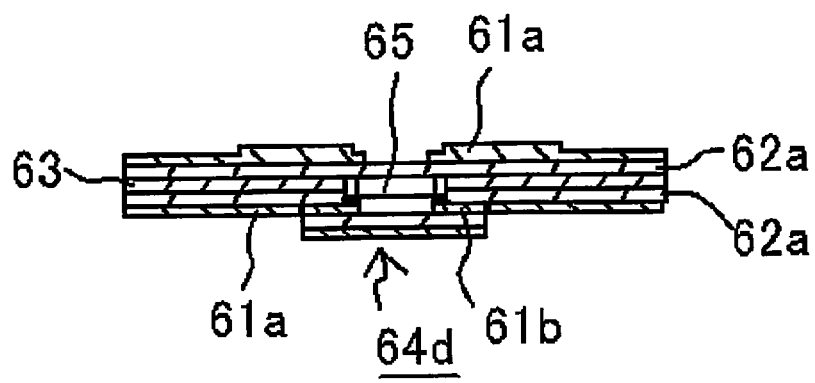
FIG. 6B is a simplified cross sectional view showing a method for manufacturing a light emitting device of another embodiment of the present invention.
Figure 6C:
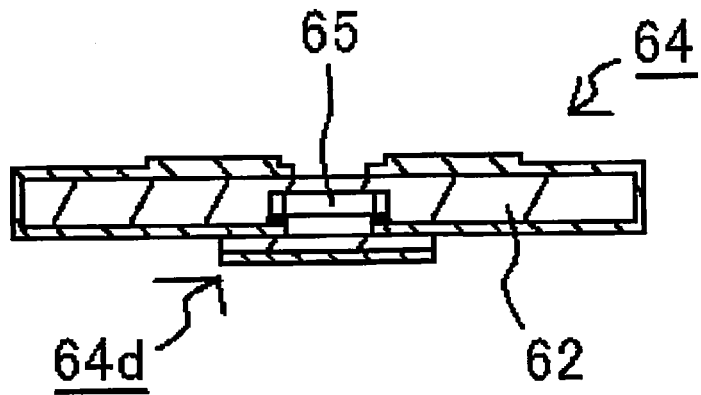
FIG. 6C is a simplified cross sectional view showing a method for manufacturing a light emitting device of another embodiment of the present invention.

In this embodiment, the base body 64 shown in FIG. 6C may be used instead of the base body 4 of the light emitting device shown in FIG. 4A. This base body 64 has a Zener diode, a varistor, or another such electronic part 65 built in at a location corresponding to a protruding component 64d.

As shown in FIG. 6A, first of all, this base body 64 has, for example, a pair of base materiales 62a with wiring patterns 61a formed on their surface, a prepreg 63, and a second base material 62b on which the electronic part 65 is installed on the wiring pattern 61b on the surface thereof. Then, as shown in FIG. 6B, the base materiales 62a, the prepreg 63, and the second base material 62b are combined and pressed together so that the pair of base materiales 62a and the prepreg 63 are integrated into a base material 62, which gives the base body 64 having the protruding component 64d in the center on the rear face side. After this, the wiring patterns on the front and rear sides are connected. This base body 64 may also be manufactured by integrally forming a plurality of bases body 64 and splitting them up according to the configuration of the composite base body 14 shown in FIG. 3A.

Other than this, the configuration is substantially the same as in Embodiment 1 and its modification examples.

This light emitting device 1D has the same effect as in Embodiment 1. Also, a high-performance light emitting device with improved electrostatic breakdown voltage, etc., can be made more compact.

Embodiment 2

As shown in FIG. 5, the light emitting device 40 in this embodiment is such that a base material 42 constituting a base body has on its second main face bent parts 42a that are bent to the second main face side.

Consequently, when the light emitting device is mounted in a side-view configuration, this prevents damage to the light reflecting member 7 by solder or the like working its way around the joint member, so short circuiting and the like can be avoided.

The bent parts 42a are at two locations, at the two ends on the second main face side. This facilitates mounting of the light emitting element, and ensures the proper strength. In addition, in mounting in a side-view configuration, the light emitting device 40 can be disposed stably, and good strength can be ensured.

The bending angle is about 30° with respect to the top face of the region of the base material 42 where the bent parts 42a are not disposed (such as the top face of the region corresponding to the region where the light emitting element 5 is installed). That is, the bending angle is set so that the height H up to the distal end of the bent part on the second main face side is about 120% of the thickness of the base material itself (such as the thickness in the region where the light emitting element is installed). More specifically, the height H is 410 µm. Consequently, good mounting stability can be ensured while simple working is possible. Also, adequate strength of the light emitting device can be achieved with the thickness of the thickness portion, without increasing the thickness of this thickest portion.

The bent part may be present not only on the second main face side, but also on the first main face side (42b in FIG. 5). The bent part 42b on the first main face side is bent to the second main face side. The position of the bent part 42b on the first main face side is a position that corresponds to the bent parts 42a on the second main face side. That is, the distance from the ends of the base material 42 is the same. This configuration facilitates machining of the base material and readily ensures good strength.

The connection terminals 43 are disposed on the first main face, from a location further to the inside than the bent parts 42a on the second main face, through the bent parts 42a, and further through one side face located between the first main face and the second main face. They are disposed on the first main face, through the bent parts 42b, near the center of the first main face, and spaced apart so as to be opposite each other. A projection pattern 43a is formed just as in Embodiment 1 on the top faces of the connection terminals 43 at opposing locations. The connection terminals are disposed so as to cover both of the bent parts 42a and 42b disposed on the first main face and the second main face.

These bent parts 42a and 42b can be formed by firing after the formation of the bent parts 42a and 42b in the formation of a sheet prior to the formation of the base material. They can also be formed after the base material has been manufactured, by partially removing both the first main face and the second main face by cutting, laser working, or the like.

This light emitting device 1C has the same effect as in Embodiment 1.

INDUSTRIAL APPLICABILITY

The light emitting device of the present invention can be used for backlight light sources of liquid crystal displays, various kinds of lighting fixtures, and various kinds of display devices such as large displays, advertisements and destination guides, and image reading devices in digital video cameras, facsimiles, copiers, scanners and the like, and projector devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
a base body equipped with a base material and a pair of connection terminals, the connection terminals being disposed from a first main face of the base body to a second main face of the base body that is on the opposite side of the first main face;
a light emitting element connected to the connection terminals on the first main face, with a light extraction face of the light emitting element being disposed on an opposite side from the base body such that light is emitted from the light emitting element toward a direction away from the base body; and
a light reflecting member that covers side faces of the light emitting element,
the base material having a protruding component on the second main face disposed between the connection terminals, the protruding component protruding further outwardly than the connection terminals in a direction normal to the base material, and
the connection terminals extending onto the first main face from both sides of the protruding component on the second main face, and being partly exposed from the light reflecting member towards two ends of the first main face.

2. The light emitting device according to claim 1, wherein the protruding component of the base material is disposed in a region of the second main face corresponding to a region where the light emitting element is installed on the first main face.

3. The light emitting device according to claim 1, wherein a thickness of the thickest region of the base body is 500 μm or less.

4. The light emitting device according to claim 1, wherein the flexural strength of the base body is 300 MPa or more.

5. The light emitting device according to claim 1, further comprising a light transmissive member disposed on an upper surface of the light emitting element, the light transmissive member containing a phosphor that is excited by light from the light emitting element.

6. The light emitting device according to claim 5, wherein the light transmissive member covers an upper surface of the light reflecting member.

7. The light emitting device according to claim 5, wherein side faces of the light transmissive member are covered by the light reflecting member.

8. The light emitting device according to claim 5, wherein a thickness from a lower end of the light emitting element to an upper end of the light transmissive member is 400 μm or less.

9. The light emitting device according to claim 1, wherein the light emitting element is flip-chip-mounted on the base body.

10. The light emitting device according to claim 1, wherein the light emitting element has a thickness of 200 μm or less.

11. The light emitting device according to claim 1, wherein the light emitting element is freed of a growth substrate of a semiconductor layer.

12. The light emitting device according to claim 1, wherein the protruding component is made of different material from the base material.

13. The light emitting device according to claim 12, wherein the protruding component includes an insulating film disposed on the base body.

14. The light emitting device according to claim 9, wherein the light reflecting member is disposed in a gap between the light emitting element and the base body.

15. The light emitting device according to claim 5, wherein the phosphor is a KSF-based phosphor.

16. The light emitting device according to claim 1, wherein the light emitting device is a side-view type light emitting device.

17. The light emitting device according to claim 1, wherein a size of the protruding component is equal to or greater than 60% of a surface area of the base body.

18. The light emitting device according to claim 1, wherein edges of the connection terminals are substantially flush with opposing edges of the base body with the opposing edges of the base body being continuously exposed.

19. The light emitting device according to claim 1, wherein the protruding component is integrally formed with the base material.

20. The light emitting device according to claim 1, wherein the light emitting element further includes a pair of electrodes connected to the connection terminals, the light extraction face of the light emitting element being disposed on an opposite side of the electrodes.

21. A light emitting device comprising:
a base body equipped with a base material and a pair of connection terminals, the connection terminals being disposed from a first main face of the base body to a second main face of the base body that is on the opposite side of the first main face;
a light emitting element connected to the connection terminals on the first main face; and
a light reflecting member that covers side faces of the light emitting element and a part of each of the connection terminals,
the base material having a bent part that is bent to the second main face side such that the first main face is inclined toward the second main face side, and
the connection terminals extending onto an inclined region of the first main face from the bent part on the second main face, and being partly exposed from the light reflecting member towards two ends of the first main face.

* * * * *